(12) United States Patent
Shimura et al.

(10) Patent No.: US 10,985,237 B2
(45) Date of Patent: Apr. 20, 2021

(54) SEMICONDUCTOR DEVICE

(71) Applicant: TOSHIBA MEMORY CORPORATION, Minato-ku (JP)

(72) Inventors: Masahiro Shimura, Yokohama (JP); Mitsuhiro Noguchi, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/564,709

(22) Filed: Sep. 9, 2019

(65) Prior Publication Data

US 2020/0295125 A1    Sep. 17, 2020

(30) Foreign Application Priority Data

Mar. 15, 2019 (JP) .................................. 2019-048013
Jun. 17, 2019 (JP) .............................. JP2019-111760

(51) Int. Cl.
*H01L 49/02* (2006.01)
*H01L 27/06* (2006.01)
*H01L 23/522* (2006.01)

(52) U.S. Cl.
CPC .......... *H01L 28/24* (2013.01); *H01L 23/5228* (2013.01); *H01L 27/0629* (2013.01)

(58) Field of Classification Search
CPC ................. H01L 28/24; H01L 23/5228; H01L 21/823462; H01L 27/0922
See application file for complete search history.

(56) References Cited

U.S. PATENT DOCUMENTS 5,049,970 A    9/1991   Tanaka et al.
6,562,689 B1   5/2003   Trivedi

FOREIGN PATENT DOCUMENTS

JP    62-263668 A    11/1987
JP    1-243570 A     9/1989

*Primary Examiner* — Anthony Ho
(74) *Attorney, Agent, or Firm* — Oblon, McClelland, Maier & Neustadt, L.L.P.

(57) ABSTRACT

A semiconductor device according to embodiments includes: a first conductivity-type first semiconductor layer set to a first potential; a second conductivity-type second semiconductor layer stacked on the first semiconductor layer and set to a second potential; an interlayer insulating film disposed on a main surface of the second semiconductor layer; a resistor disposed above the first semiconductor layer while interposing the second semiconductor layer and the interlayer insulating film therebetween; and a terminal electrically connected to the second semiconductor layer.

13 Claims, 13 Drawing Sheets

SEMICONDUCTOR DEVICE

CROSS REFERENCE TO RELATED APPLICATIONS

This application is based upon and claims the benefit of priority from prior Japanese Patent Application P2019-048013 filed on Mar. 15, 2019 and Japanese Patent Application P2019-111760 filed on Jun. 17, 2019; the entire contents of which are incorporated by reference herein.

FIELD

Embodiments described herein relate generally to a semiconductor device including a resistor.

BACKGROUND

In a semiconductor device in which a semiconductor integrated circuit is formed on a semiconductor substrate, a high voltage generated inside the semiconductor device is sometimes used for the semiconductor integrated circuit. For example, in a semiconductor device including a nonvolatile semiconductor storage element, a high voltage ranging approximately from 10 V to 35 V is generated in the semiconductor device during an operation thereof. Under a condition where such a high voltage is used, a resistor having a high resistance value and a high withstand voltage is used. In order to obtain a stable output, it is necessary that the resistance value of the resistor to which the high voltage is applied be stable.

DETAILED DESCRIPTION

Figure 1:
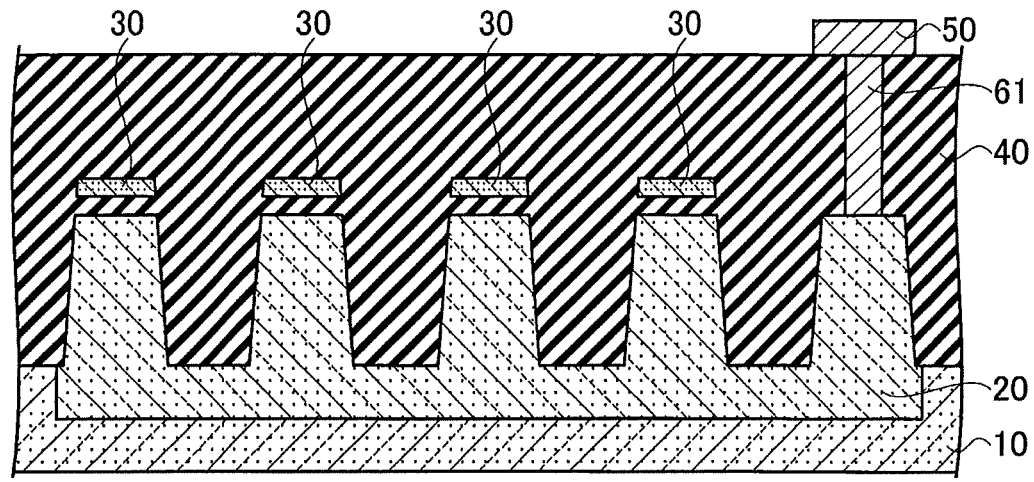
FIG. 1 is a schematic cross-sectional view illustrating a configuration of a semiconductor device according to a first embodiment.

In accordance with embodiments, a semiconductor device includes: a first conductivity-type first semiconductor layer set to a first potential; a second conductivity-type second semiconductor layer stacked on the first semiconductor layer and set to a second potential; an interlayer insulating film disposed on a main surface of the second semiconductor layer; a resistor disposed above the first semiconductor layer while interposing the second semiconductor layer and the interlayer insulating film therebetween; and a terminal electrically connected to the second semiconductor layer.

Hereinafter, a description will be given of the embodiments with reference to the drawings. In the description of the drawings, the same reference numerals are assigned to the same portions, and a description thereof is omitted.

First Embodiments

As illustrated in FIG. 1, a semiconductor device according to a first embodiment of the present invention includes: a first conductivity-type first semiconductor layer 10; a second conductivity-type second semiconductor layer 20 stacked on the first semiconductor layer 10; an interlayer insulating film 40 disposed on a main surface of the second semiconductor layer 20; and resistors 30 disposed above the first semiconductor layer 10 while interposing the second semiconductor layer 20 and the interlayer insulating film 40 therebetween. The first semiconductor layer 10 is set to a first potential, and the second semiconductor layer 20 is set to a second potential. The second potential is the first potential or an intermediate potential between the first potential and a potential of the resistors 30 (hereinafter, this potential will be referred to as "resistance potential"). Then, a potential difference between the first potential and the second potential is smaller than a withstand voltage of a pn junction formed on an interface between the first semiconductor layer 10 and the second semiconductor layer 20.

The first conductivity type and the second conductivity type are conductivity types opposite to each other. That is, if the first conductivity type is the p type, then the second conductivity type is the n type, and the first conductivity type is the n type, then the second conductivity type is the p type. Hereinafter, a description will be given of the case where the first conductivity type is the p type and the second conductivity type is the n type.

In the semiconductor device illustrated in FIG. 1, the p-type first semiconductor layer 10 is set to the ground potential. That is, the first potential is the ground potential. The n-type second semiconductor layer 20 is formed, for example, by diffusing n-type impurities implanted into an upper portion of the first semiconductor layer 10. The second semiconductor layer 20 is electrically connected to a power supply terminal 50, which is disposed on an upper surface of the interlayer insulating film 40, while interposing a power supply via 61 therebetween. The power supply via 61 penetrates the interlayer insulating film 40 and reaches the second semiconductor layer 20. By applying the second potential to the power supply terminal 50, the second semiconductor layer 20 is set to the second potential.

The semiconductor device illustrated in FIG. 1 is an embodiment in which the resistors 30 are mounted on a semiconductor substrate mixedly with a nonvolatile semiconductor storage element (not illustrated). That is, the first semiconductor layer 10 corresponds to a semiconductor substrate on which the nonvolatile semiconductor storage element is formed. Recesses of the second semiconductor layer 20 correspond to element isolation trenches of a transistor, and have a depth ranging approximately from 100 nm to 600 nm. Thus, the upper surface of the second semiconductor layer 20 has an irregular shape. The resistor 30 is disposed above a protrusion of the upper surface of the second semiconductor layer 20. Thus, the upper surface of the second semiconductor layer 20 has an uneven shape. The resistor 30 is disposed above the protrusion of the upper surface of the second semiconductor layer 20.

The interlayer insulating film 40 below the resistors 30 correspond to a gate insulating film. The interlayer insulating film 40 is, for example, a silicon oxide film, a silicon oxynitride film or the like. A film thickness of the interlayer insulating film 40 below the resistors 30 ranges, for example, approximately from 13 nm to 50 nm.

The resistors 30 are formed using a manufacturing process of a gate electrode of a transistor. For example, a polysilicon film having a film thickness ranging approximately from 40 nm to 400 nm is doped with impurities such as phosphorous (P) having a concentration equal to or more than $1E19$ atoms/cm$^3$, whereby the resistors 30 are formed. At this time, the resistors 30 are formed to an approximate size where a width is 150 nm to 500 nm and a length is 0.5 μm to 40 μm, whereby such resistors 30 having a resistance value ranging from several kiloohms (kΩ) to several ten kiloohms (kΩ) are obtained. As described above, the resistors 30 are formed as semiconductor elements in each of which a semiconductor film is doped with impurities. Note that a semiconductor film other than the polysilicon film may be doped with p-type impurities and n-type impurities, whereby the resistors 30 may be formed.

In a NAND-type flash memory applied with a high voltage during an operation thereof, a high voltage is generated inside the semiconductor device. Therefore, a resistor having a high resistance value at which a current does not flow is used. In the case of achieving a high resistance value by doping a semiconductor film with impurities, a shape of the resistor is lengthened in consideration of temperature dependency of semiconductor resistivity. For example, a ratio of a length and width of the resistor is set to approximately 100 to 1.

Figure 2:
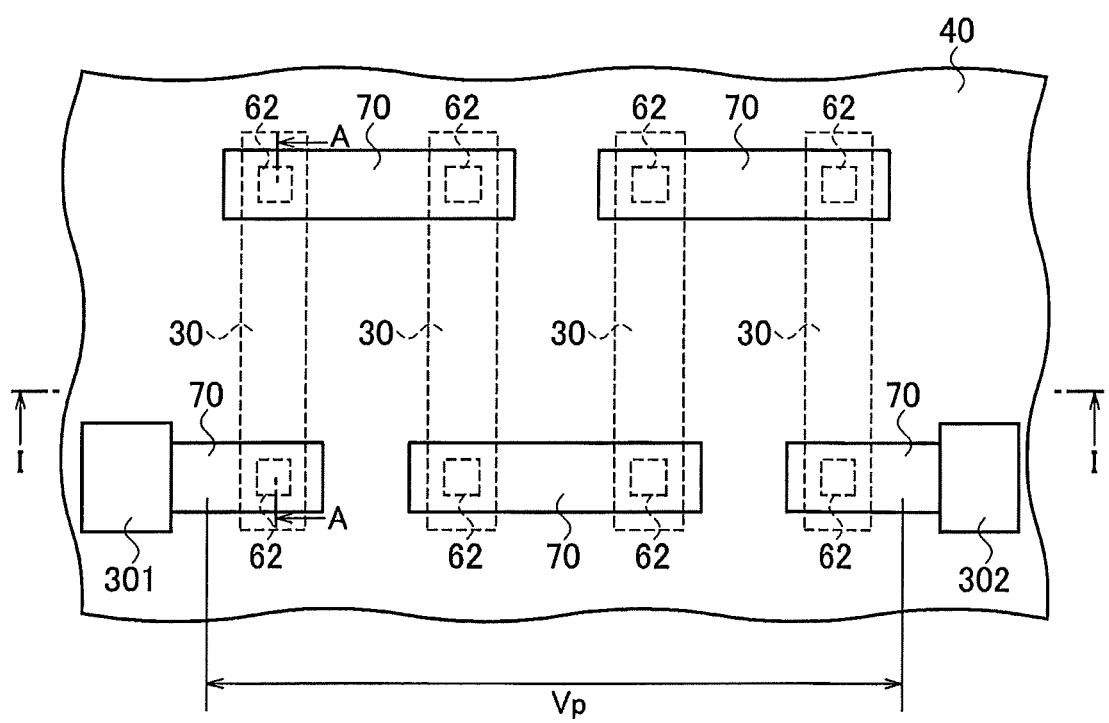
FIG. 2 is a schematic plan view illustrating the configuration of the semiconductor device according to the first embodiment.

Then, for example as illustrated in FIG. 2, a plurality of the resistors 30 are connected with one another, whereby a combined resistor having a resistance value of several kΩ to several hundred kΩ is formed. FIG. 1 is a cross-sectional view along a direction I-I of FIG. 2. FIG. 2 illustrates an example of a combined resistor in which four resistors 30 are connected in series to one another by wires 70 arranged on the upper surface of the interlayer insulating film 40; however, it is a matter of course that the form of the combined resistor is not limited to this. That is, parallel connection and serial connection of the resistors 30 are arbitrarily connected with each other, whereby a combined resistor with a desired resistance value can be achieved.

FIG. 2 illustrates the resistors 30 through the interlayer insulating film 40. The resistors 30 and the wires 70 are electrically connected to each other by wiring vias 62 formed in the interlayer insulating film 40 below the wires 70.

As described above, the combined resistor is formed by connecting the resistors 30 to each other by the wire 70 disposed in the wiring layer different in plane level from the layer in which the resistor 30 is formed. In the example shown in FIG. 2, the resistors 30 are connected in series by the wire 70 disposed on the upper surface of the interlayer insulating film 40. That is, through the wiring vias 62 which penetrate the interlayer insulating film 40, the wires 70 disposed on the upper surface of the interlayer insulating film 40 formed above the resistors 30 and the resistors 30 are alternately connected.

During the operation of the semiconductor device, a voltage (hereinafter, referred to as "resistance voltage Vp") is applied between the first terminal 301 and the second terminal 302 connected by the wiring 70 to the both ends of the combined resistor illustrated in FIG. 2. For example, the first terminal 301 is set to the ground potential, and the resistance voltage Vp is applied to the second terminal 302. When the resistance voltage Vp is large, the resistor 30 is set to a high potential. The resistance voltage Vp is, for example, approximately 10 V to 35 V. Therefore, assuming that the second semiconductor layer 20 is not disposed between the first semiconductor layer 10 and the resistors 30, then a large electric field is generated between the first semiconductor layer 10 set to the ground potential (GND) and the resistors 30.

The inventors of the present invention have found that, when a large electric field is generated between the resistor and a region adjacent to the resistor in the case where the semiconductor film is doped with the impurities to form the resistor, a phenomenon that the resistance value of the resistor varies (hereinafter, this phenomenon will be referred to as "resistance value shift"). This is caused by the fact that a state of electric charges on a surface of the resistor changes by being affected by the electric field. That is, the resistance value shift occurs when a potential difference between a potential of a region adjacent to a resistor while interposing an insulating film therebetween (hereinafter, this potential will be referred to as "substrate potential") and a potential of the resistor is large.

On the other hand, according to the semiconductor device shown in FIG. 1, the resistance value shift of the resistors 30 can be suppressed even when the resistors 30 are semiconductor elements in which semiconductor films are doped with impurities and a high voltage is applied to the resistors 30. Hereinafter, the suppression of the resistance value shift by the semiconductor device illustrated in FIG. 1 will be described in comparison with a semiconductor device of a comparative example illustrated in FIG. 3.

Figure 3:
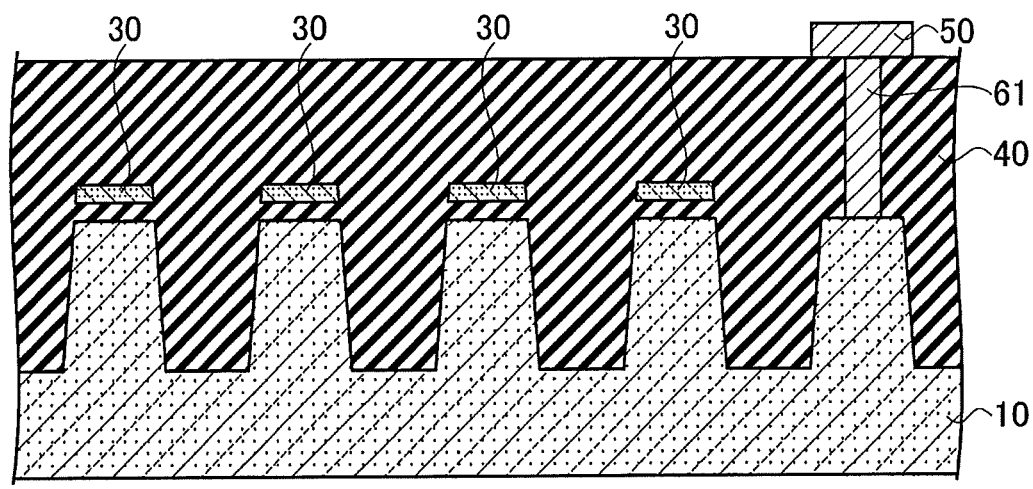
FIG. 3 is a schematic cross-sectional view illustrating a configuration of a semiconductor device of a comparative example.

The semiconductor device of the comparative example illustrated in FIG. 3 includes: a p-type first semiconductor layer 10 set to the ground potential; and resistors 30 arranged above the first semiconductor layer 10 while interposing an interlayer insulating film 40 therebetween. The first semiconductor layer 10 is electrically connected to a power supply terminal 50 at the ground potential via a power supply via 61. Portions of the first semiconductor layer 10, which are located immediately below the resistors 30, extend upward, and an interval between the resistors 30 and the first semiconductor layer 10 is narrowed. This interval is similar to an interval between the resistors 30 and the second semiconductor layer 20 in the semiconductor device according to the first embodiment.

That is, the semiconductor device of the comparative example is different from the semiconductor device according to the embodiment illustrated in FIG. 1 in that the second semiconductor layer 20 is not disposed between the first semiconductor layer 10 and the resistors 30. Since a potential of the first semiconductor layer 10 is the ground potential, a substrate potential of the semiconductor device of the comparative example is 0 V. Therefore, when the resistors 30 are applied with a high voltage, a large electric field is generated between the first semiconductor layer 10 and the resistors 30.

Figure 4:
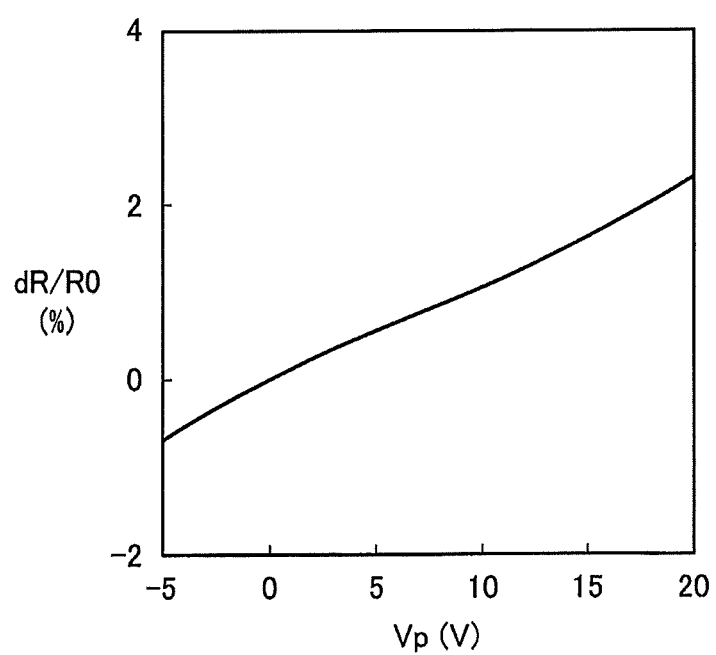
FIG. 4 is a graph illustrating a relationship between a voltage applied to a resistor and a fluctuation of a resistance value of the resistor.

FIG. 4 illustrates a relationship between a resistance voltage Vp applied to the resistors 30 and a fluctuation of a resistance value of the resistors 30. An axis of ordinates of a graph illustrated in FIG. 4 is a resistance ratio (dR/R0) of a fluctuation amount dR of the resistance value with respect to a resistance value R0 of the resistors 30 when the substrate potential is 0 V.

As illustrated in FIG. 4, the resistance value of the resistor 30 fluctuates as the resistance voltage Vp is larger. That is, as a potential difference between the substrate potential and the resistance potential is larger, a change of the resistance value of the resistors 30 by the resistance value shift is larger. Moreover, in the semiconductor device of the comparative example, most of the voltage applied to the resistors 30 is applied to the interlayer insulating film 40 located immediately below the resistors 30. Therefore, the interlayer insulating film 40 may deteriorate with age.

For this, in the semiconductor device according to the first embodiment, the second semiconductor layer 20 capable of setting a potential independently of the potential of the first semiconductor layer 10 is disposed between the first semiconductor layer 10 and the resistors 30. The second potential of the second semiconductor layer 20 is the substrate potential, and the second potential is set to the first potential or an intermediate potential between the first potential of the first semiconductor layer 10 and the resistance potential of the resistor 30. Therefore, in comparison with the semiconductor device of the comparative example, the potential difference between the substrate potential and the resistance potential decreases. In this way, the resistance value shift of the resistors 30 is suppressed. Moreover, the voltage applied to the interlayer insulating film 40 located immediately below the resistors 30 decreases.

Note that the second potential is set so that the potential difference between the first potential and the second potential becomes lower than the withstand voltage of the pn junction formed on the interface between the first semiconductor layer 10 and the second semiconductor layer 20. This is in order to suppress a leak current between the first semiconductor layer 10 and the second semiconductor layer 20.

Figure 5:
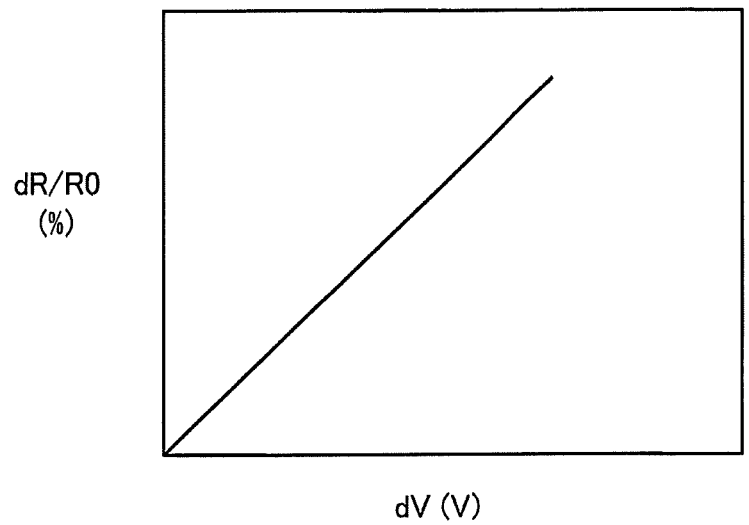
FIG. 5 is a graph illustrating a relationship between a potential of the resistor and a fluctuation of the resistance value of the resistor.

FIG. 5 illustrates a relationship between the potential of the resistors 30 and the fluctuation of the resistance value of the resistors 30. An axis of ordinates of a graph illustrated in FIG. 5 is a resistance ratio (dR/R0) of a fluctuation amount dR of the resistance value with respect to the resistance value R0 of the resistors 30 when the second potential that is the substrate potential is 0 V. An axis of abscissas is a potential difference dV (dV=Vr−Vsi) between the resistance potential Vr and the second potential Vsi that is the substrate potential.

As illustrated in FIG. 5, the larger the potential difference dV is, the larger the resistance ratio (dR/R0) is. That is, as the second potential Vsi is smaller, the change of the resistance value of the resistors 30 by the resistance value shift is larger. The semiconductor device of the comparative example illustrated in FIG. 3 corresponds to the case where the second potential Vsi is 0 V, where the potential difference dV is large.

Meanwhile, in the semiconductor device according to the first embodiment, the second semiconductor layer 20 set to the second potential Vsi is disposed below the resistors 30, and accordingly, the potential difference dV can be reduced more than in the semiconductor device of the comparative example illustrated in FIG. 3. As described above, in accordance with the semiconductor device according to the first embodiment, the resistance value shift can be suppressed.

As illustrated in FIG. 5, as the potential difference dV is reduced by bringing the second potential Vsi of the second semiconductor layer 20 close to the resistance potential Vr, the resistance ratio (dR/R0) becomes smaller, and the resistance value shift is suppressed. However, the second potential Vsi is set so that the potential difference between the first semiconductor layer 10 and the second semiconductor layer 20 becomes lower than the withstand voltage of the pn junction formed on the interface between the first semiconductor layer 10 and the second semiconductor layer 20. In this way, the leak current between the first semiconductor layer 10 and the second semiconductor layer 20 is suppressed, and performance and reliability of the semiconductor device are suppressed from decreasing.

Figure 6:
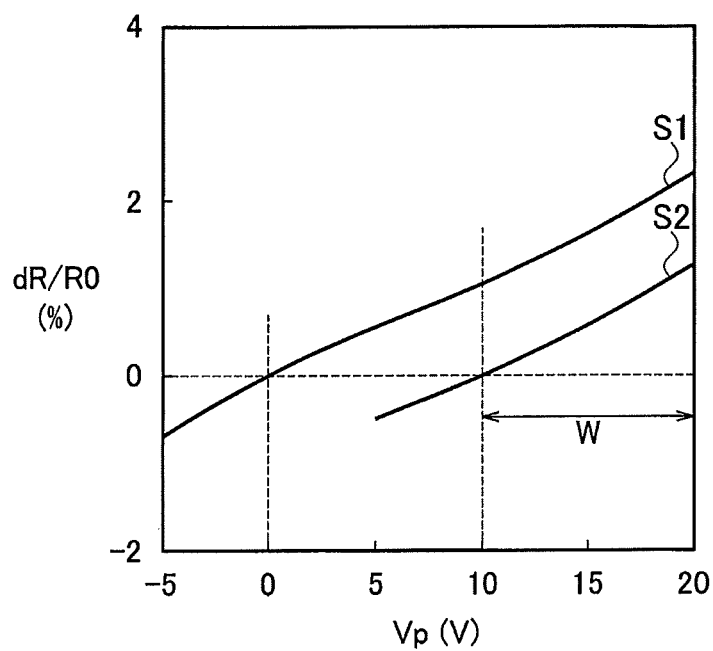
FIG. 6 is a graph comparing the fluctuations of the resistance values of the resistors of the semiconductor device according to the first embodiment and of the semiconductor device of the comparative example.

FIG. 6 illustrates an example of the relationships between the resistance voltages Vp and the fluctuations of the resistance values of the resistors 30 regarding the semiconductor device of the comparative example illustrated ion FIG. 3 and the semiconductor device according to the first embodiment. In FIG. 6, a magnitude of the fluctuation of the resistance value is defined as the resistance ratio (dR/R0), the resistance ratio (dR/R0) of the semiconductor device of the comparative example is represented by a characteristic S1, and the resistance ratio (dR/R0) of the semiconductor device according to the first embodiment is represented by a characteristic S2. Note that the characteristic S1 is similar to the fluctuation of the resistance value, which is illustrated in FIG. 4.

As illustrated in FIG. 6, in the semiconductor device according to the first embodiment, the resistance ratio (dR/R0) shifts to be smaller than in the semiconductor device of the comparative example illustrated in FIG. 3. That is, in accordance with the semiconductor device according to the first embodiment, the fluctuation of the resistance values of the resistors 30 is suppressed in a range W of the resistance voltage Vp of the resistors 30 during an operation, the range W being illustrated in FIG. 6. For example, when the resistance voltage Vp is less than 5 V, the potential of the second semiconductor layer 20 is the same potential as the first potential, and the resistance value shift of the semiconductor device according to the first embodiment is equivalent to that of the semiconductor device of the comparative example. Meanwhile, when the resistance voltage Vp is equal to or more than 5 V, if the potential of the second semiconductor layer 20 is 10 V in the case of FIG. 6, then the resistance value shift of the semiconductor device according to the first embodiment becomes equivalent to that in the case of Vp−5 V in the semiconductor device of the comparative example. That is, the fluctuation of the resistance value of the resistors 30 in the semiconductor device according to the first embodiment is similar to that in the semiconductor device of the comparative example in the case where the resistance voltage Vp is −5 V to +5 V.

Moreover, in the semiconductor device according to the first embodiment, the voltage applied to the interlayer insulating film 40 disposed below the resistors 30 is reduced. Therefore, such an aging deterioration of the interlayer insulating film 40 can be prevented.

As described above, in accordance with the semiconductor device according to the first embodiment, the resistance value shift of the resistors 30 can be suppressed. Moreover, an aging deterioration of the interlayer insulating film 40 is suppressed, and the reliability of the semiconductor device is improved.

For example, when the potential difference between the first semiconductor layer 10 in which the first potential is the ground potential and the resistors 30 ranges approximately from 10 V to 35 V, the second potential is set to approximately 5 V. The semiconductor device according to the first embodiment is suitably used for a semiconductor device in which the resistors 30 are formed on the same semiconductor substrate as that for a nonvolatile semiconductor storage element that uses a high voltage during an operation thereof.

Hereinafter, a method for manufacturing the semiconductor device according to the first embodiment of the present invention will be described with reference to the drawings. FIG. 7 to FIG. 10, FIGS. 11A, 12A, 13A, 14A and 15A are cross-sectional views along a direction A-A of FIG. 2, and FIGS. 11B, 12B, 13B, 14B and 15B are cross-sectional views along the direction I-I of FIG. 2 unless otherwise particularly described. Note that the method for manufacturing a semiconductor device, which will be mentioned below, is merely an example, and the semiconductor device is achievable by a variety of manufacturing methods other than this mentioned method, the manufacturing methods including modified examples thereof.

Figure 7:
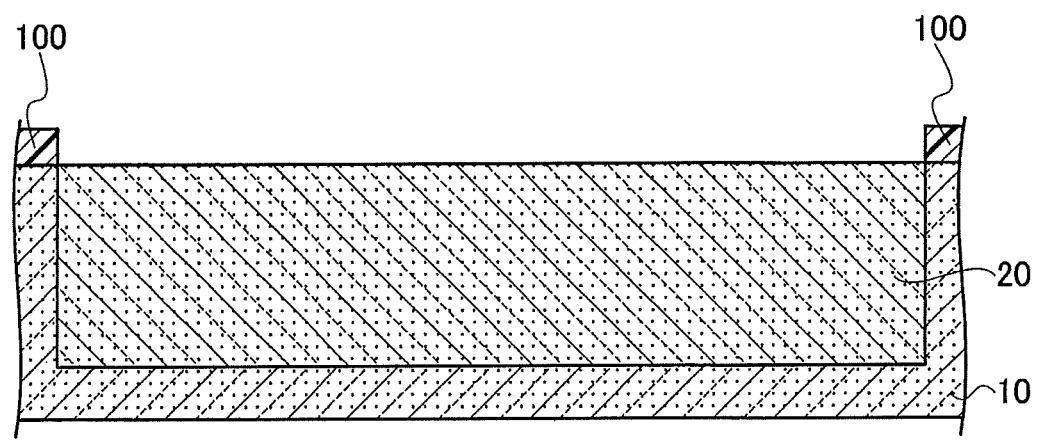
FIG. 7 to FIG. 15B are schematic process cross-sectional views for explaining a method for manufacturing the semiconductor device according to the first embodiment.
Figure 8:
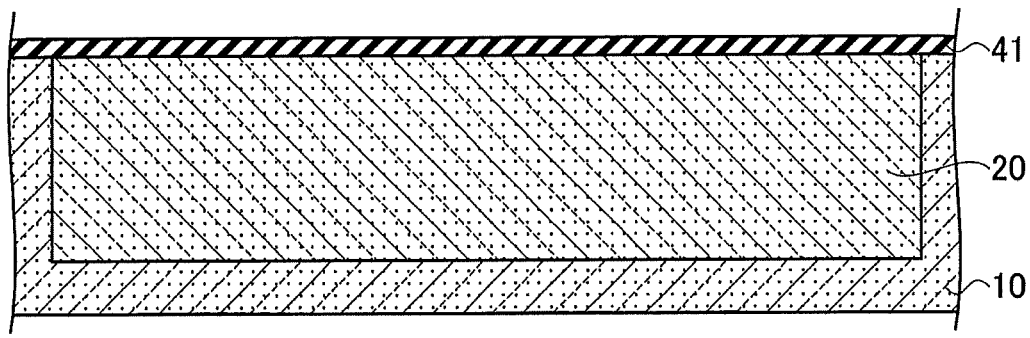

As illustrated in FIG. 7, a photoresist film 100 patterned using a photolithography technology is used as a mask, n-type impurities are selectively implanted onto the p-type first semiconductor layer 10, whereby the second semiconductor layer 20 is formed. Subsequently, as illustrated in FIG. 8, a first insulating film 41 is formed on the main surface of the second semiconductor layer 20. The first insulating film 41 correspond to the interlayer insulating film 40 below the resistors 30.

Figure 9:
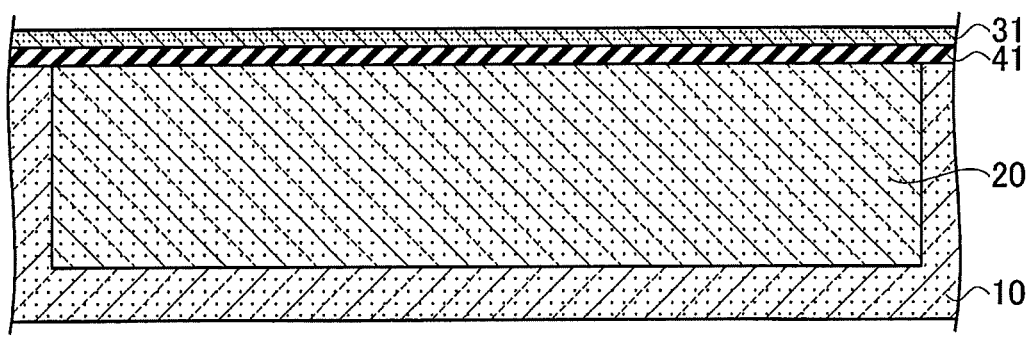
Figure 10:
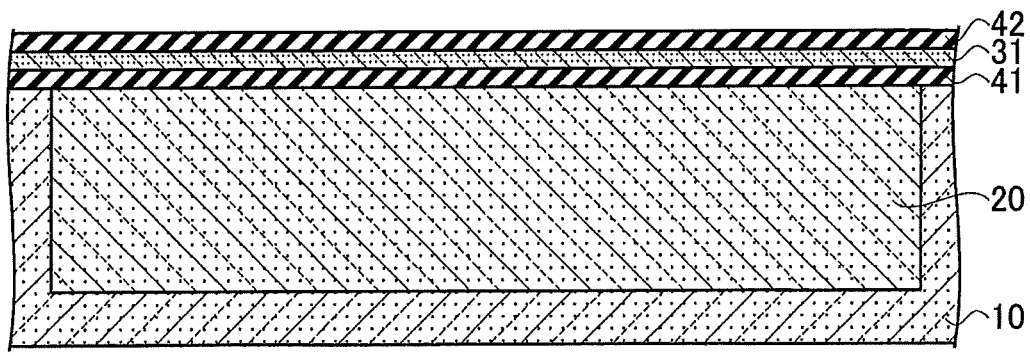

As illustrated in FIG. 9, a polysilicon film 31 is formed on an upper surface of the first insulating film 41. Impurities of the polysilicon film 31 may be mixed, for example, during deposition of the polysilicon film 31. Alternatively, the impurities may be ion-implanted into the polysilicon film 31. Thereafter, as illustrated in FIG. 10, a second insulating film 42 is formed on an upper surface of the polysilicon film 31.

Figure 11A:
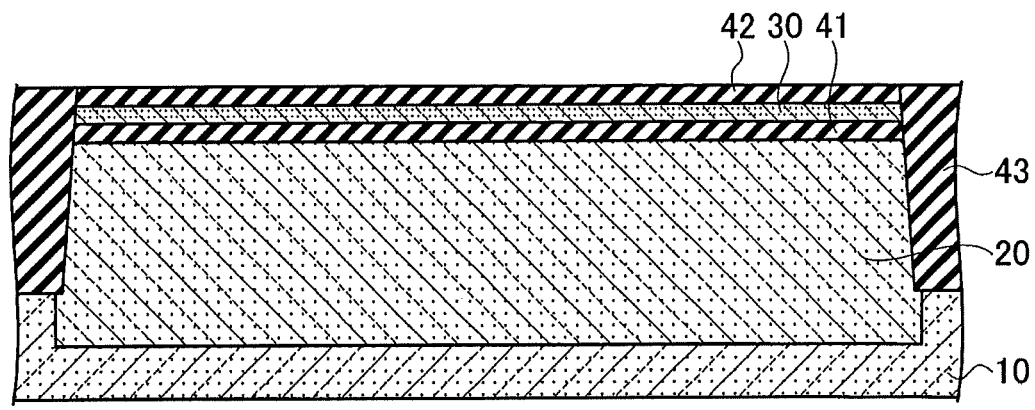
Figure 11B:
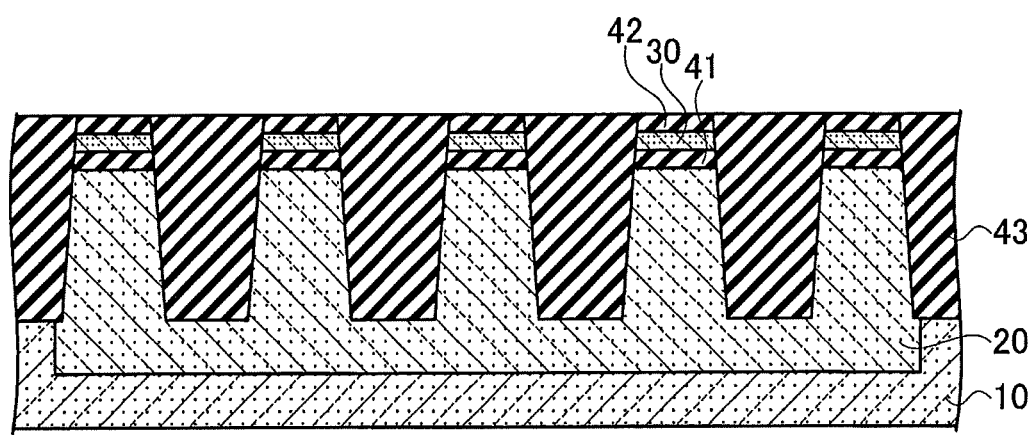

Next, as illustrated in FIG. 11A and FIG. 11B, the polysilicon film 31 is patterned using the photolithography technology, whereby the resistors 30 are formed. At this time, simultaneously with a forming step of the element isolation trenches of the transistor, the first insulating film 41 and the second semiconductor layer 20, which are located on the peripheries of the resistors 30, are removed by etching. Regions subjected to such etching removal are filled with third insulating films 43.

Figure 12A:
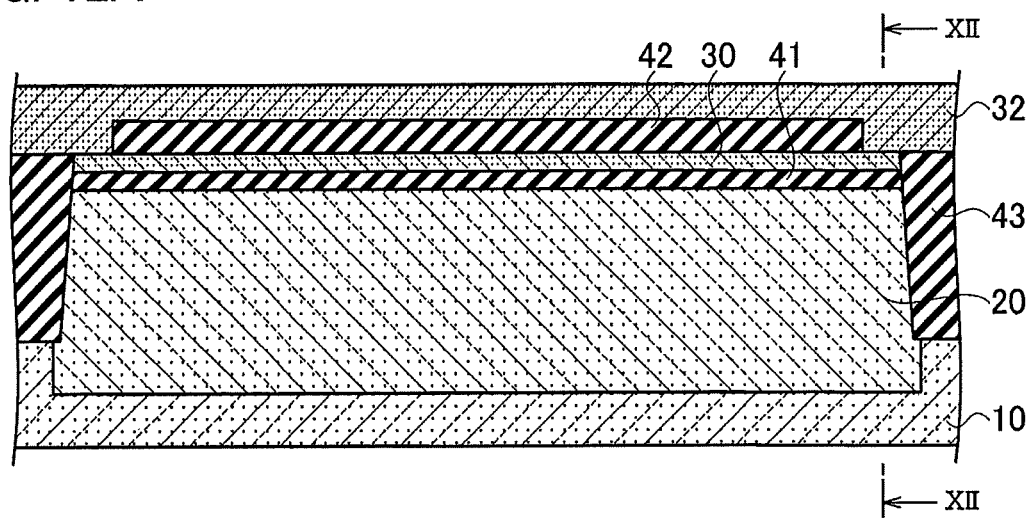
Figure 12B:
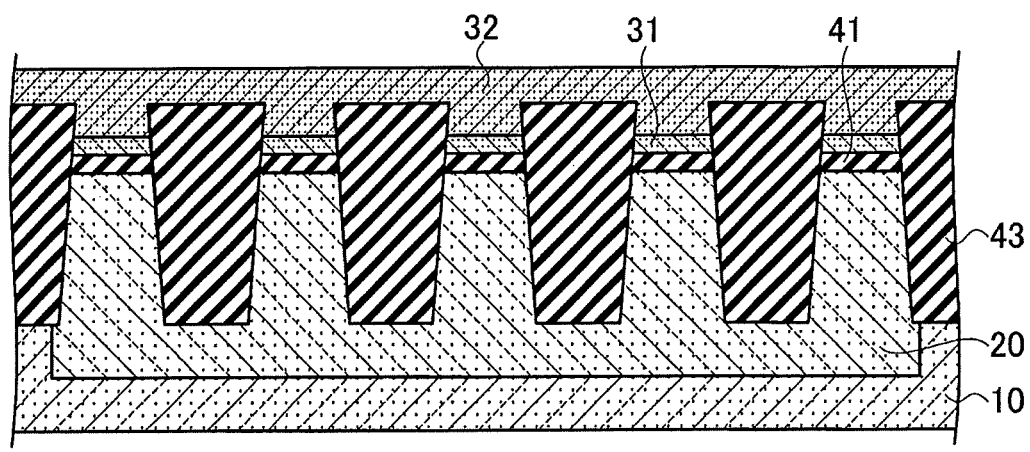

Note that, when there is a step of additionally forming a polysilicon film, the second insulating film 42 is patterned as illustrated in FIG. 12A and FIG. 12B. Thereafter, an additional polysilicon film 32 is formed. FIG. 12B is a cross-sectional view along a direction XII-XII of FIG. 12A.

Figure 13A:
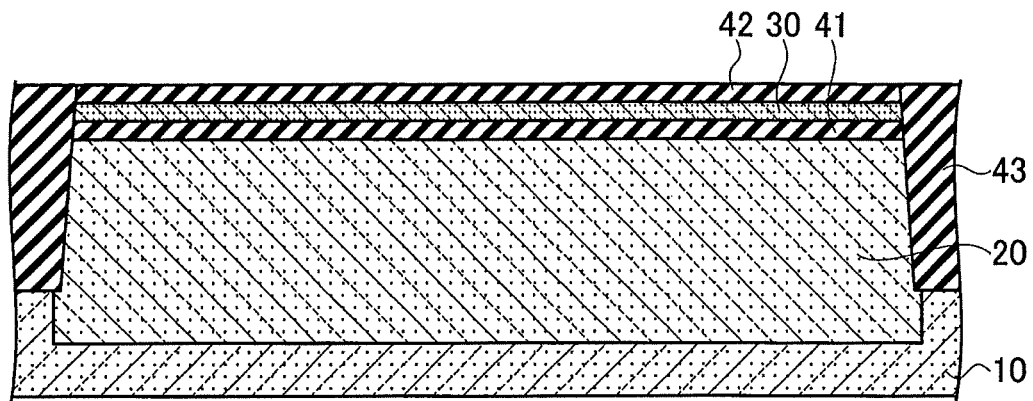
Figure 13B:
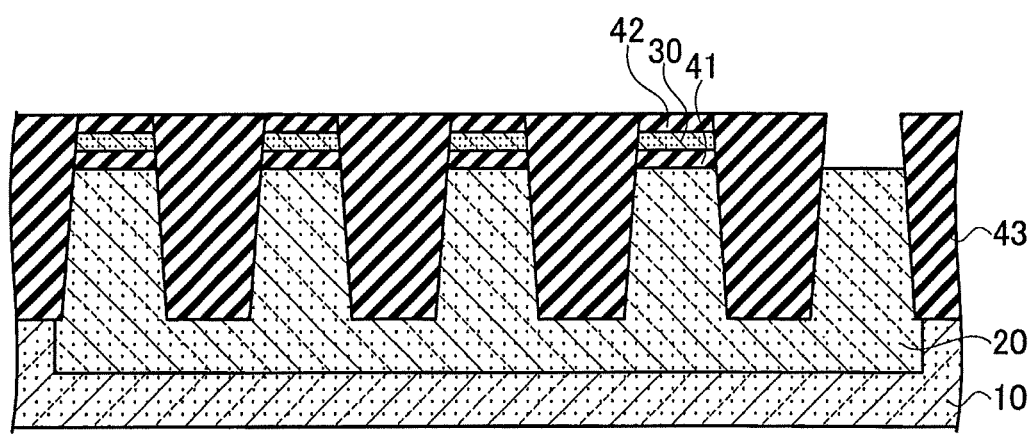
Figure 14A:
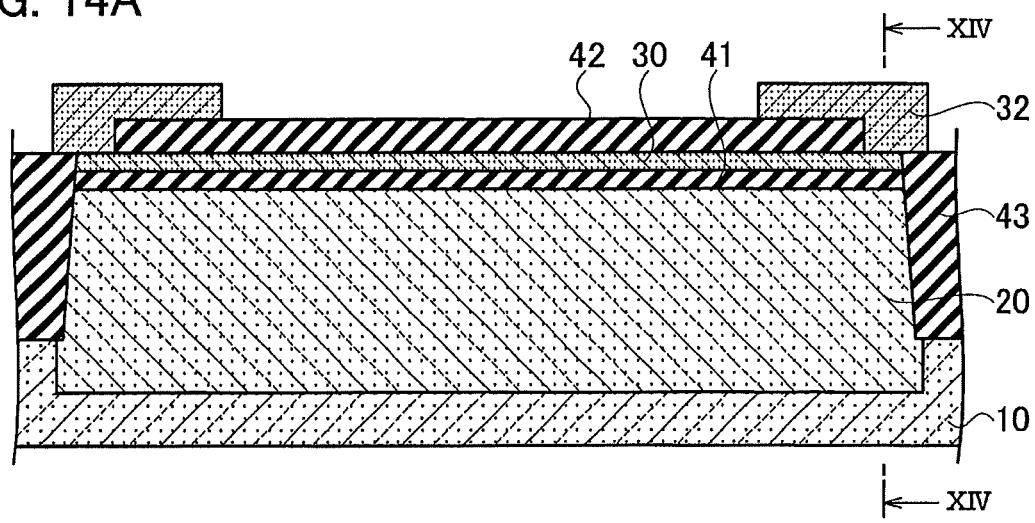
Figure 14B:
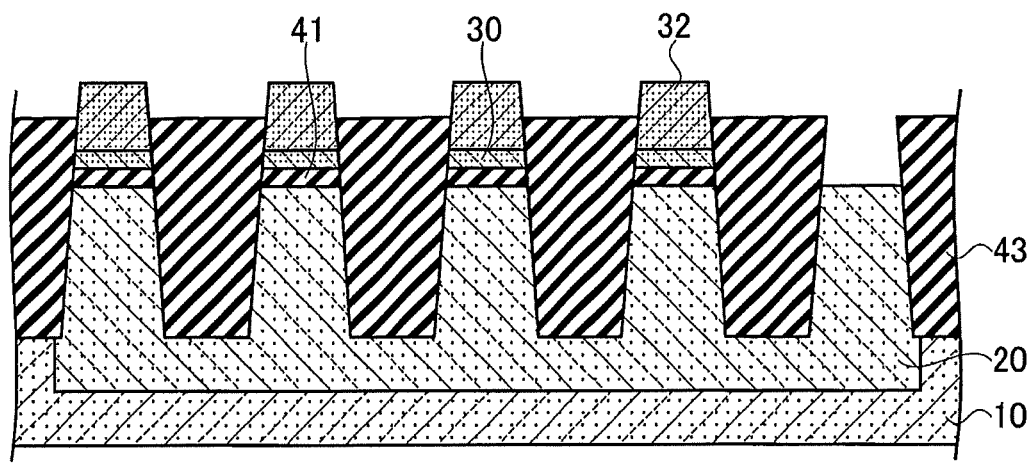

Subsequently, as illustrated in FIG. 13A and FIG. 13B, the second insulating film 42, the polysilicon film 31 and the first insulating film 41 in a region where the power supply via 61 is to be formed are removed, and a part of an upper surface of the second semiconductor layer 20 is exposed. Also when the step of additionally forming a polysilicon film is present, as illustrated in FIG. 14A and FIG. 14B, a part of the upper surface of the second semiconductor layer 20 is exposed similarly. FIG. 14B is a cross-sectional view along a direction XIV-XIV of FIG. 14A.

Figure 15A:
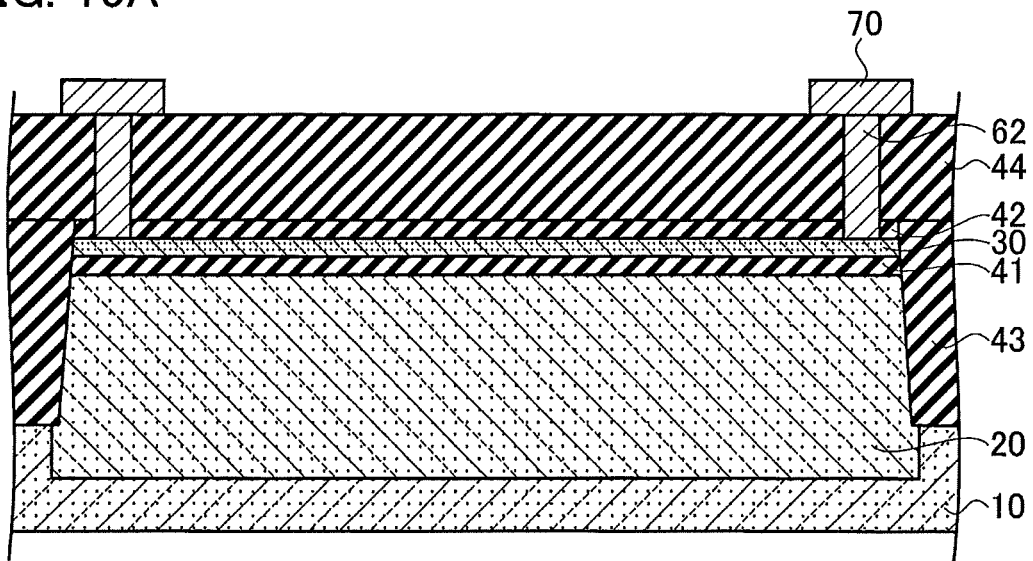
Figure 15B:
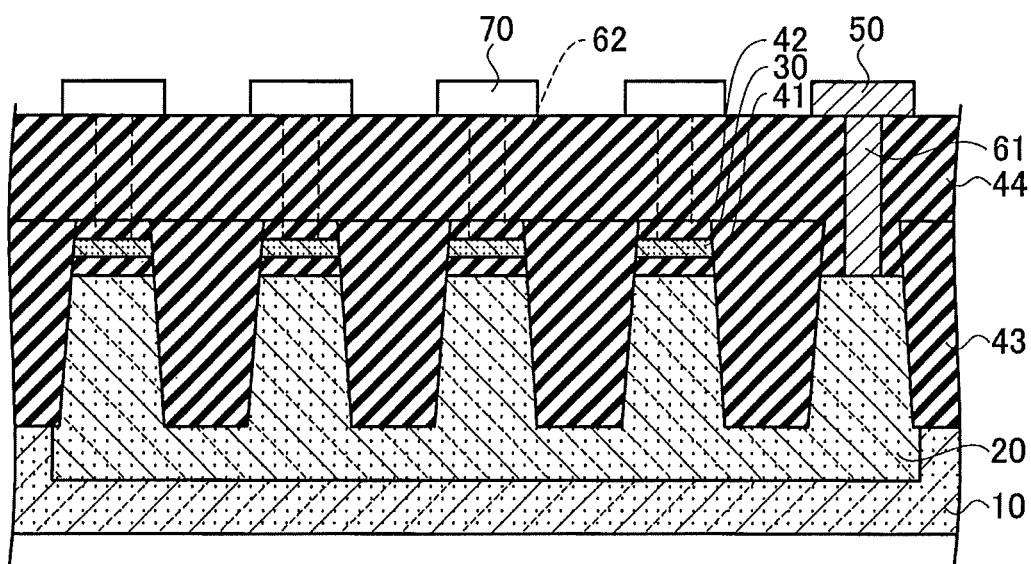

Thereafter, a fourth insulating film 44 is formed on the entire surface. Then, as illustrated in FIG. 15A and FIG. 15B, the power supply via 61 that penetrates the fourth insulating film 44 is formed using the photolithography technology and etching. Moreover, wiring vias 62 which penetrate the second insulating film 42 and the fourth insulating film 44 are formed. Furthermore, the power supply terminal 50 and the wires 70 are formed, whereby the semiconductor device according to the first embodiment is completed. The first insulating film 41, the second insulating film 42, the third insulating film 43 and the fourth insulating film 44 correspond to the interlayer insulating film 40 illustrated in FIG. 1.

Note that, in the case of mixedly mounting the resistors 30 and the nonvolatile semiconductor storage element on the same semiconductor substrate, a memory cell is formed before forming the fourth insulating film 44. Moreover, in the case of forming a single polysilicon film, a layer of metal such as silicide may be formed on an interface where the polysilicon film and a bottom of the via are in contact with each other.

The description has been given above of the case where the first semiconductor layer 10 is a semiconductor substrate; however, the semiconductor device according to the first embodiment is also applicable to a semiconductor device having another configuration.

Figure 16:
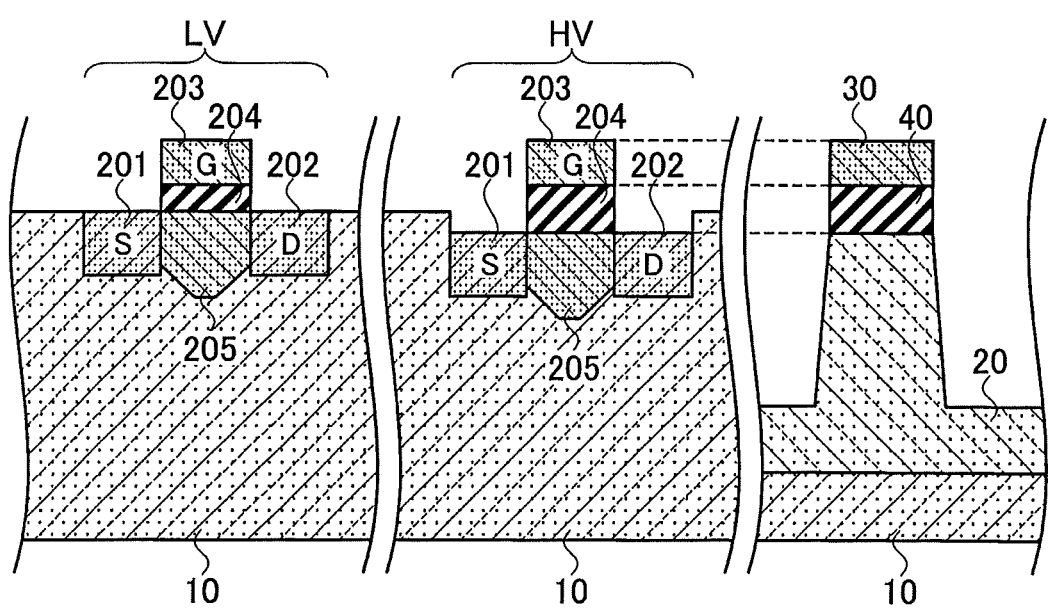
FIG. 16 is a schematic cross-sectional view illustrating an example in which the transistor and the resistor are formed on the same semiconductor substrate.

The resistor 30 may be formed on the semiconductor substrate on which low breakdown voltage transistor and high breakdown voltage transistor having different gate insulating film are formed. FIG. 16 shows an example of the low breakdown voltage transistor LV, the high breakdown voltage transistor HV, and the resistor 30 formed on the same semiconductor substrate. In both of the low breakdown voltage transistor LV and the high breakdown voltage transistor HV, the n-type region 205 is formed between the n-type source electrode 201 and the drain electrode 202, and the gate electrode 203 is disposed above the n-type region 205 via the gate insulating film 204. The low breakdown voltage transistor LV is a transistor giving priority to the switching speed, and the thickness of the gate insulating film 204 is about several nm. The high breakdown voltage transistor HV is a transistor in which the breakdown voltage is prioritized, and the film thickness of the gate insulating film 204 is approximately 13 nm to 50 nm.

The film thickness of the interlayer insulating film 40 below the resistor 30 is formed to be equal to that of the gate insulating film 204 of the high breakdown voltage transistor HV. As shown in FIG. 16, the upper surface of the gate electrode 203 of the high breakdown voltage transistor HV and the upper surface of the resistor 30 are at the same plane level. In order to make the structure easy to understand, FIG. 16 shows only the interlayer insulating film 40 below the resistor 30 as the interlayer insulating film 40 around the resistor 30.

Second Embodiment

Figure 17:
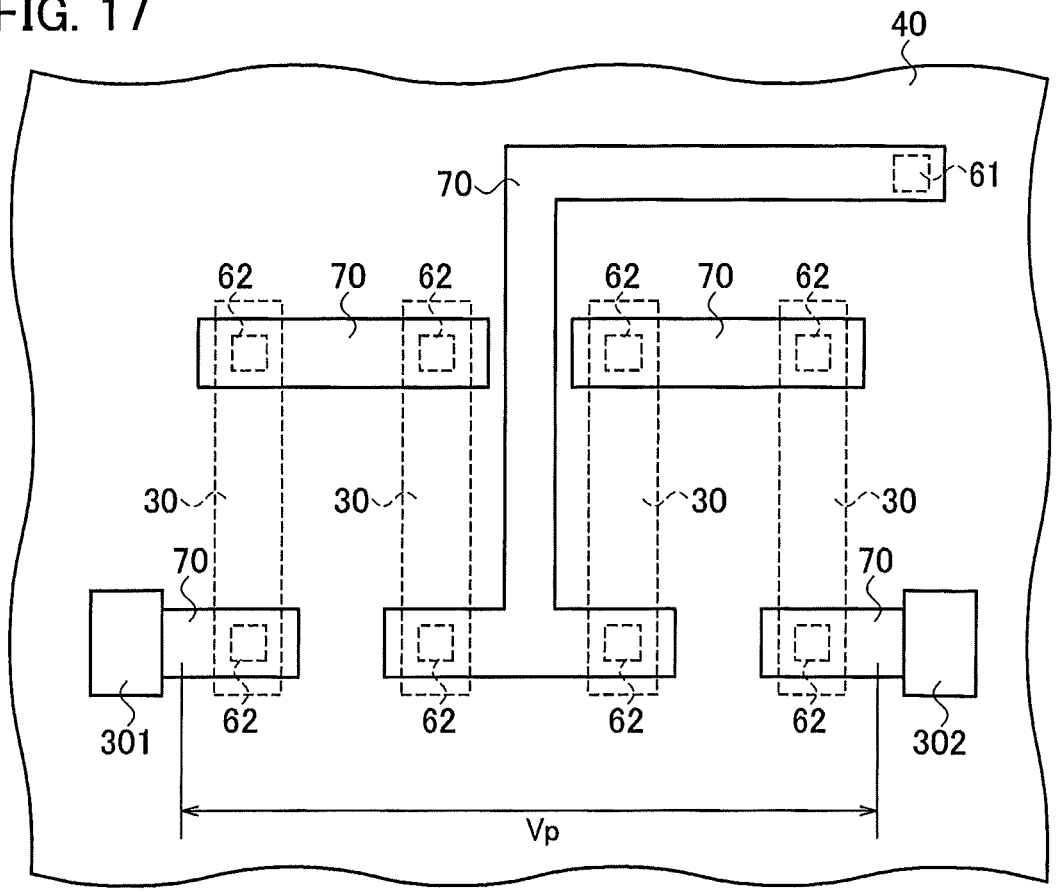
FIG. 17 is a schematic plan view illustrating a configuration of a semiconductor device according to a second embodiment.

A semiconductor device according to a second embodiment includes a single combined resistor in which the plurality of resistors 30 are connected in series to one another via the wiring vias 62 and the wires 70. FIG. 17 illustrates an example where four resistors 30 are connected in series to one another to form the combined resistor. Then, the second semiconductor layer 20 is electrically connected to any of the resistors 30, whereby the second semiconductor layer 20 is set to the second potential. That is, the semiconductor device according to the second embodiment is different from the first embodiment illustrated in FIG. 1 in terms of generating the second potential by resistance division of the combined resistor. Other configurations of the second embodiment are the same as those of the first embodiment.

Figure 18:
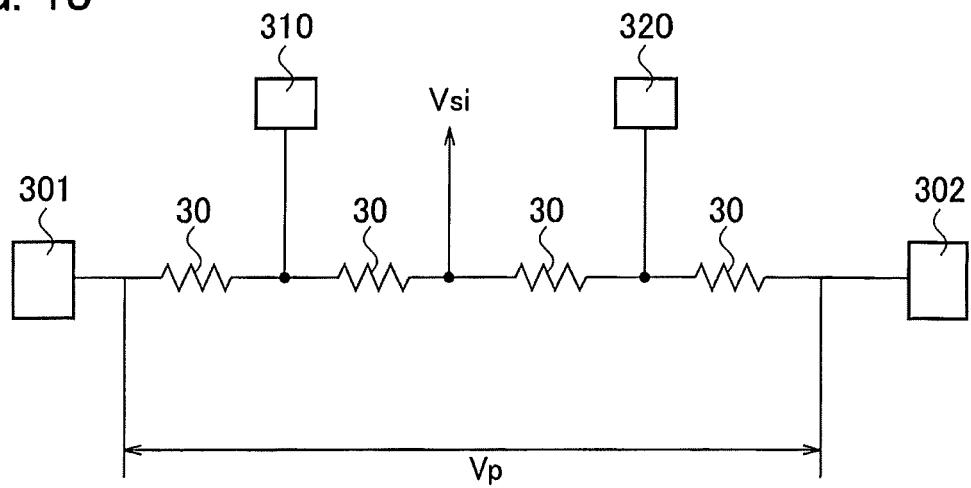
FIG. 18 is a circuit diagram illustrating the configuration of the semiconductor device according to the second embodiment.

In the semiconductor device illustrated in FIG. 17, one of mutual connection points of the resistors 30 and the second semiconductor layer 20 are electrically connected to each other via the wire 70 disposed on the upper surface of the interlayer insulating film 40 and via the power supply via 61. FIG. 18 illustrates a circuit diagram of the semiconductor device according to the second embodiment. The second potential is generated by resistor-dividing the resistance voltage Vp applied to both ends of the combined resistor. Further, the connection terminal maybe set at an arbitrary position of the combined resistor, and the potential generated at the connection terminal may be used for the circuit operation of the semiconductor device. FIG. 18 shows an example in which the connection terminals 310 and 320 are set at the connection points of the resistors 30. The combined resistor in which the connection terminals 310 and 320 are set is used for generation of a voltage by resistance division, pull-down resistance, measures against ripples, and the like.

Therefore, in accordance with the semiconductor device according to the second embodiment, it is not necessary to dispose a special circuit for generating the second potential set for the second semiconductor layer 20. Accordingly, the circuit configuration and the chip size can be suppressed from increasing.

Note that the plurality of resistors 30 having the same shape and arranged periodically may be connected with one another to form the combined resistor, and the second potential corresponding to a resistance ratio of the combined resistor may be generated. In this way, the second potential can be generated as a potential with a constant ratio with respect to the resistance voltage Vp. Therefore, variations in manufacture of the second potential can be suppressed. Moreover, the potential with a constant ratio with respect to the resistance voltage Vp is applied to the interlayer insulating film 40, and the aging deterioration of the interlayer insulating film 40 can be suppressed.

Figure 19:
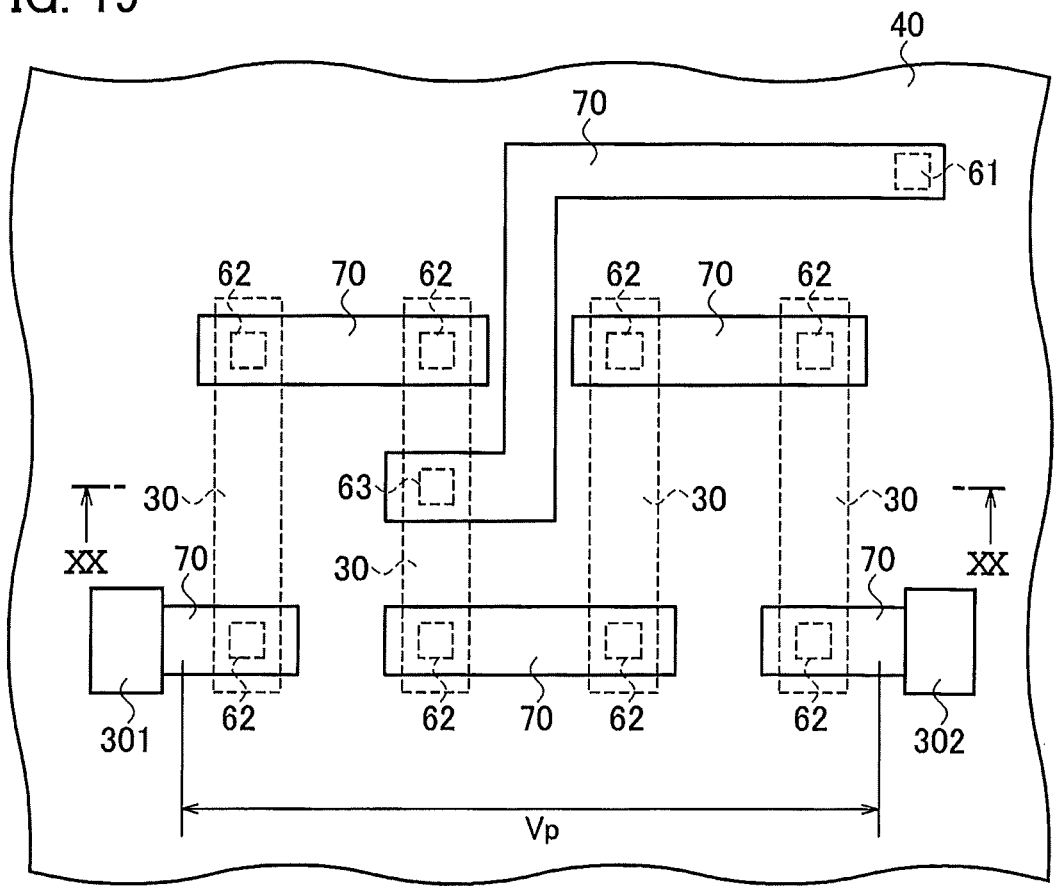
FIG. 19 is a schematic plan view illustrating another configuration of the semiconductor device according to the second embodiment.
Figure 20:
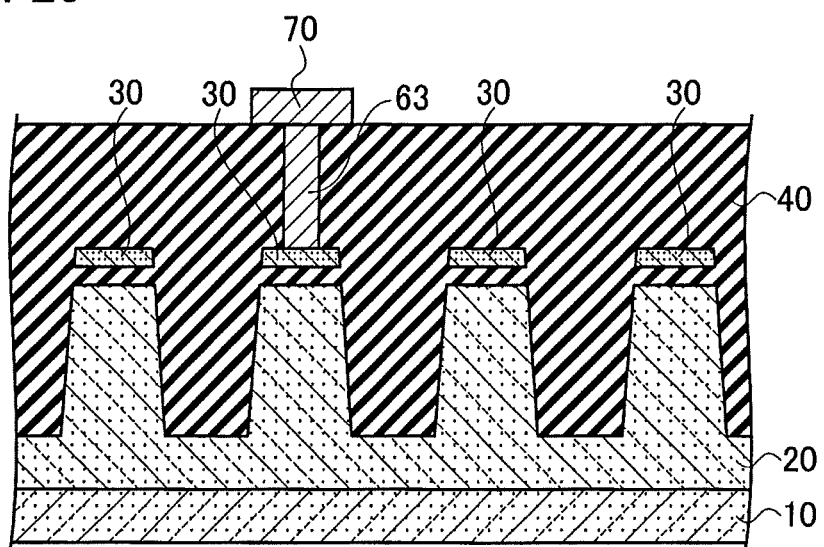
FIG. 20 is a schematic cross-sectional view along a direction XX-XX of FIG. 19.

Moreover, FIG. 17 illustrates the semiconductor device in which any of the mutual connection points of the resistors 30 and the second semiconductor layer 20 are electrically connected to each other; however, an arbitrary position of a specific one of the resistors 30 and the second semiconductor layer 20 may be electrically connected to each other. In this case, for example, as illustrated in FIG. 19 and FIG. 20, a resistance via 63 to be connected to the resistor 30 can be formed, and the resistors 30 and the second semiconductor layer 20 can be electrically connected to each other via the resistance via 63 the wires 70 and the power supply via 61.

While certain embodiments have been described, these embodiments have been presented by way of example only, and are not intended to limit the scope of the inventions. Indeed, the novel embodiments described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first conductivity-type first semiconductor layer set to a first potential;
   a second conductivity-type second semiconductor layer stacked on the first semiconductor layer and set to a second potential;
   an interlayer insulating film disposed on a main surface of the second semiconductor layer; and
   a resistor disposed above the first semiconductor layer while interposing the second semiconductor layer and the interlayer insulating film therebetween; and
   a terminal electrically connected to the second semiconductor layer.

2. The semiconductor device according to claim 1, wherein the second potential is the first potential or an intermediate potential between the first potential and a potential of the resistor, and a potential difference between the first potential and the second potential is smaller than a withstand voltage of a pn junction formed on an interface between the first semiconductor layer and the second semiconductor layer.

3. The semiconductor device according to claim 1, wherein the resistor is a semiconductor film doped with impurities.

4. The semiconductor device according to claim 1,
   wherein a plurality of the resistors are connected with one another to form a single combined resistor, and
   the second semiconductor layer is electrically connected to any of the plurality of resistors, and the second semiconductor layer is set to the second potential.

5. The semiconductor device according to claim 4, wherein the plurality of resistors having a same shape and arranged periodically are connected with one another to form the combined resistor.

6. The semiconductor device according to claim 4, wherein any of mutual connection points of the plurality of resistors and the second semiconductor layer are electrically connected to each other.

7. The semiconductor device according to claim 4, wherein the combined resistor is formed by alternately connecting the resistors and wires disposed on an upper surface of an insulating film formed above the resistors.

8. The semiconductor device according to claim 1, wherein an upper surface of the second semiconductor layer has an irregular shape in which a depth of a recess is 100 nm to 600 nm, and the resistor is disposed above a protrusion of the upper surface of the second semiconductor layer.

9. The semiconductor device according to claim 8, wherein the terminal is disposed on an upper surface of the interlayer insulating film and electrically connected to the protrusion on the upper surface of the second semiconductor layer via a via penetrating the interlayer insulating film.

10. The semiconductor device according to claim 1, wherein the second potential is closer to a potential of the resistor than the first potential is.

11. The semiconductor device according to claim 1, wherein a periphery of a lower portion of the second semiconductor layer is surrounded by the first semiconductor layer.

12. The semiconductor device according to claim 1, wherein a film thickness of the interlayer insulating film below the resistor is 13 nm to 50 nm.

13. The semiconductor device according to claim 1, wherein the resistor is a polysilicon film doped with impurities and having a film thickness of 40 nm to 400 nm.

* * * * *